(12) United States Patent
Park

(10) Patent No.: US 11,094,388 B1
(45) Date of Patent: Aug. 17, 2021

(54) ANTI-FUSE DEVICE AND PROGRAM METHOD USING THE SAME

(71) Applicant: Winbond Electronics Corp., Taichung (TW)

(72) Inventor: Chan Jong Park, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/933,973

(22) Filed: Jul. 20, 2020

(51) Int. Cl.
  *G11C 17/18* (2006.01)
  *H01L 27/112* (2006.01)
  *G11C 17/16* (2006.01)
  *H01L 23/525* (2006.01)

(52) U.S. Cl.
  CPC .............. *G11C 17/18* (2013.01); *G11C 17/16* (2013.01); *H01L 23/5252* (2013.01); *H01L 27/11206* (2013.01)

(58) Field of Classification Search
  CPC ........................................................ G11C 17/18
  USPC ....................................................... 365/225.7
  See application file for complete search history.

(56) References Cited

U.S. PATENT DOCUMENTS

| 6,108,261 A * | 8/2000 | Kim ..................... G11C 29/785 365/225.7 |
| 7,573,095 B2 | 8/2009 | Lee et al. |
| 9,691,756 B2 | 6/2017 | Kwon |
| 2018/0102909 A1 * | 4/2018 | Wu ......................... G11C 17/16 |
| 2018/0158533 A1 * | 6/2018 | Zhou ................. H01L 27/11206 |
| 2020/0051651 A1 * | 2/2020 | Hoang ................ H01L 23/5252 |

FOREIGN PATENT DOCUMENTS

KR    20010005683    1/2001

* cited by examiner

*Primary Examiner* — Muna A Techane
(74) *Attorney, Agent, or Firm* — JCIPRNET

(57) ABSTRACT

An anti-fuse device includes an anti-fuse array and a biasing circuit. The anti-fuse array includes an anti-fuse cell that has a gate node, a gate oxide layer and a source-drain node. The biasing circuit is coupled to the anti-fuse array and is configured to bias the gate node of the anti-fuse cell with a first bias voltage during a program operation, and bias the source-drain node of the anti-fuse with a second bias voltage during the program operation. A voltage level of the first bias voltage is lower than a voltage level of the second bias voltage, and a voltage difference between the first bias voltage and the second bias voltage is higher than a gate oxide breakdown voltage of the gate oxide layer.

16 Claims, 6 Drawing Sheets

ANTI-FUSE DEVICE AND PROGRAM METHOD USING THE SAME

BACKGROUND

Technical Field

The disclosure generally relates to anti-fuse device, and more particularly relates to an anti-fuse device and a program method thereof that are capable of confining a region where a conductive path is formed in a program operation, thereby improving performance of the anti-fuse device.

Description of Related Art

An anti-fuse cell is usually implemented with metal oxide semiconductor (MOS) structure which has a gate region and a drain region and a source region. As demand for high quality anti-fuse devices has grown recently, there is a need for an anti-fuse device and a program method thereof that is capable of confining the region where the conductive paths are formed in the program operation.

SUMMARY

An anti-fuse device and a program method there of that are capable of confining the region where the conductive paths are formed in a program operation are introduced.

In some embodiments, the program method may include steps of biasing a gate node of an anti-fuse cell with a first bias voltage during a program operation; and biasing a source-drain node of the anti-fuse with a second bias voltage during the program operation, wherein a voltage level of the first bias voltage is lower than a voltage level of the second bias voltage, and a voltage difference between the first bias voltage and the second bias voltage is higher than a gate oxide breakdown voltage of the gate oxide layer.

In some embodiments, the anti-fuse device includes an anti-fuse array, and a biasing circuit. The anti-fuse array includes an anti-fuse cell that includes a gate node, a gate oxide layer and a source-drain node. The biasing circuit is coupled to the anti-fuse array and is configured to bias the gate node of the anti-fuse cell with a first bias voltage during a program operation. The biasing circuit is further configured to bias the source-drain node of the anti-fuse with a second bias voltage during the program operation. A voltage level of the first bias voltage is lower than a voltage level of the second bias voltage, and a voltage difference between the first bias voltage and the second bias voltage is higher than a gate oxide breakdown voltage of the gate oxide layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
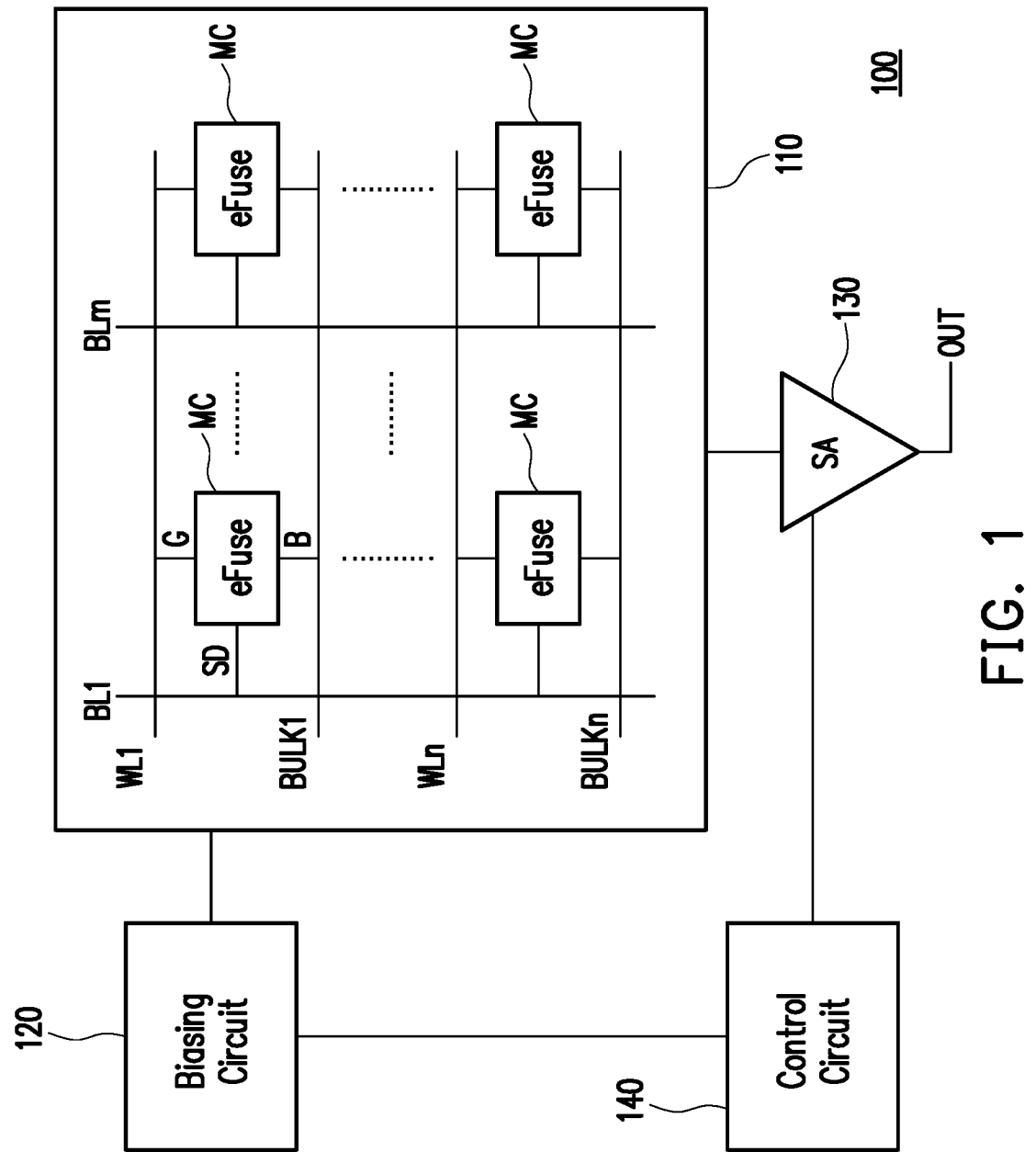
FIG. 1 is a schematic diagram illustrating an anti-fuse device in accordance with some embodiments.

Referring to FIG. 1, an anti-fuse device 100 in accordance with some embodiments are illustrated. The anti-fuse device 100 may include an anti-fuse array 110, a biasing circuit 120, a sense amplifier 130 and a control circuit 140. The memory array 110 may include a plurality of anti-fuse cells MC that are coupled to a plurality of word lines WL1 through WLn, a plurality of bit lines BL1 through BLm and a plurality of bulk lines BULK1 through BULKn, where m and n are positive integers. An operation such as a program operation or a read operation is performed to the anti-fuse cells MC through the word lines WL1 through WLn, the bit lines BL1 through BLm and the bulk lines BULK1 through BULKN. Each of the anti-fuse cells MC is coupled to one of the word lines WL1 through WLn, one of the bit lines BL1 through BLm and one of the bulk lines BULK1 through BULKn. In some embodiments, each of the anti-fuse cells MC is implemented with a metal oxide semiconductor (MOS) structure that includes a gate node, a source node, a drain node and a bulk node. In some embodiments, the drain node and the source node of each of the anti-fuse cell MC is coupled to each other to form a common source-drain node. As shown in FIG. 1, there is an anti-fuse cell MC that is coupled to the word line WL1 through a gate node G, is coupled to the bit line BL1 through the common source-drain node SD, and is coupled to the bulk line BULK1 through the bulk node B.

The biasing circuit 120 is coupled to the anti-fuse cell 110 and is configured to generate and provide bias voltages to the anti-fuse cells MC of the anti-fuse array 110 in an operation. The operation may include a program operation which is configured to form a conductive path between the gate node and the source-drain node of the anti-fuse cell. In other words, the program operation to a specific anti-fuse cell is configured to change the specific anti-fuse cell from a non-conductive state (e.g., high resistance state) to the conductive state (e.g., low resistance state). In some embodiments, the program operation to the specific anti-fuse cell is a one-time-programming (OTP) operation that is configured to form a permanent conductive path between the gate node and the source-drain node of the specific anti-fuse cell. The operation may also include a read operation that is configured to read data stored in each of the anti-fuse cells of the anti-fuse array 110. The data stored in each of the anti-fuse cells of the anti-fuse array 110 may have a low resistance state or a high resistance state.

In the program operation to the specific anti-fuse cell, the biasing circuit 120 may generate and provide program bias voltages to the gate node G, the source-drain node S/D and the bulk node B of the specific anti-fuse cell. For example, the biasing circuit 120 may generate a gate bias voltage, a source-drain bias voltage and a bulk bias voltage that are applied to the gate node G, the source-drain node SD and the bulk node B during the program operation, respectively. A voltage difference between the gate bias voltage and the source-drain bias voltage are configured to form conductive paths between the gate node and the source-drain node of the specific anti-fuse cell.

In the read operation to the specific anti-fuse cell, the biasing circuit 120 may generate and provide read bias voltages to the gate node G, the source-drain node SD and the bulk node B of the specific anti-fuse cell. In some embodiments, the sense amplifier 130 is coupled to the anti-fuse array 110 and is configured to read the data stored in the anti-fuse cells MC of the anti-fuse array 110. In some embodiments, the sense amplifier 130 may be coupled to the word lines WL1 through WLn of the anti-fuse array 110, and is configured to read the data stored in the anti-fuse cells of the anti-fuse array 110 via signals in the word lines WL1 through WLn. The sense amplifier 130 may compare the signals in the word lines WL1 through WLn to a reference signal to determine the data value of the data stored in the anti-fuse cells MC of the anti-fuse array 110. The output signal OUT of the sense amplifier 130 may indicate the data value stored in the anti-fuse cells MC of the anti-fuse array 110. In some alternative embodiments, the sense amplifier 130 may be coupled to the bit lines BL1 through BLm and is configured to read the data stored in the anti-fuse cells MC of the anti-fuse array 110 via signals in the bit lines BL1 through BLm.

The control circuit 140 may include at least one logic circuit that is configured to control overall operation of the anti-fuse device 100. In some embodiments, the control circuit 140 is coupled to the biasing circuit 120 and is configured to control the biasing circuit 120 to generate the bias voltages for the program operation and the read operation on the anti-fuse cells MC. The control circuit 140 may be coupled to the sense amplifier 130 and is configured to control operations of the sense amplifier 130 during the read operation on the anti-fuse cells MC of the anti-fuse array 110.

Figure 2A:
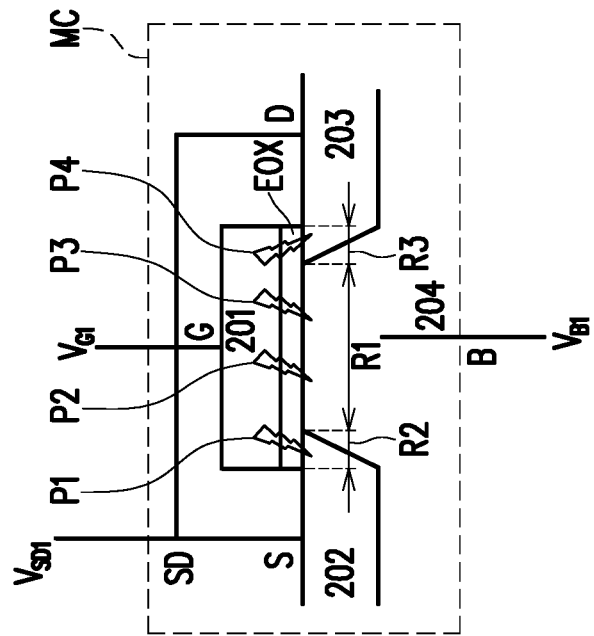
FIG. 2A is a schematic diagram illustrating a structure of an anti-fuse cell in accordance with some embodiments.

Referring to FIG. 2A, a schematic diagram of an anti-fuse cell MC in accordance with some embodiments is illustrated. The anti-fuse cell MC in FIG. 2A may be any one of the anti-fuse cells MC of the anti-fuse array 110 in FIG. 1. The anti-fuse cell MC may have the MOS structure that includes a gate node G, a source node S, a drain node D and a bulk node B, in which the source node may be electrically connected to the drain node to form a source-drain node SD. The gate node G, the source node S, the drain node D and the bulk node B are coupled to a gate region 201, a source region 202, a drain region 203 and a semiconductor substrate 204, respectively. The source region 202 and the drain region 203 are doped regions in a semiconductor substrate 204, and the gate region 201 is formed above the semiconductor substrate 204. In some embodiments, the semiconductor substrate 204 is a p-type semiconductor substrate, and the source region 202 and the drain region 203 are n-type doped regions. It is noted that semiconductor types of the semiconductor substrate 204, the source region 202 and the drain region 204 may change according to designed needs. In some embodiments, the anti-fuse cell MC includes a gate oxide layer EOX that is disposed between the gate region 201 and the semiconductor substrate 204. During the program operation to the anti-fuse cell MC, bias voltages VG, VSD and VB are applied to the gate node G, the source-drain node SD and the bulk node B, respectively to breakdown the gate oxide layer EOX, thereby forming conductive paths between the gate node G and the source-drain node SD.

In some embodiments, parts of the gate region 201 overlaps the source region 202 and the drain region 203 in a direction D2, and other parts of the gate region 201 do not overlap the source region 202 and the drain region 203. As shown in FIG. 2A, in the direction D2, a region R2 of the source region 202 overlaps a projection of a left-side edge region of the gate region 201, and region R3 of the drain region 203 overlaps a projection of a right-side edge region of the gate region 201. The region R1 of the semiconductor substrate 204 is non-overlapped region between the projection of the gate region 201 and the source region 202 and the drain region 203. In some embodiments, the region R1 is also referred to as an under-gate region.

Figure 2B:
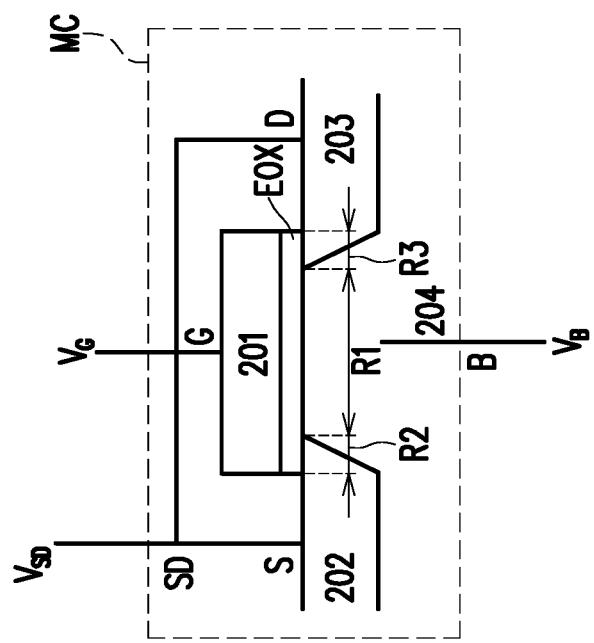
FIGS. 2B and 2C illustrate formation of conductive paths in the anti-fuse cell in program operations in accordance with some embodiments.

FIG. 2B illustrates an anti-fuse cell MC and bias voltages $V_{G1}$, $V_{SD1}$ and $V_{B1}$ that are applied to the anti-fuse cell MC in a program operation, in which a voltage level of the gate bias voltage $V_{G1}$ is higher than the voltage level of the source-drain voltage $V_{SD1}$. The same elements of the anti-fuse cells shown in FIG. 2A and FIG. 2B are illustrated using the same reference numbers. In the program operation, the gate bias voltage $V_{G1}$ may have a positive voltage level and the source-drain voltage $V_{SD1}$ may have a negative voltage level or a ground voltage level. As the gate node G is biased by the positive voltage $V_{G1}$ and the source-drain node SD is biased by the ground voltage or negative voltage $V_{SD1}$, the conductive paths may be randomly formed in the gate region 201 and the under-gate region. For example, a conductive path P1 may be formed between the gate region 201 and the source region 202, a conductive path P4 may be formed between the gate region 201 and the drain region 203, and conductive paths P2 and P3 may be randomly formed in the under-gate region. As the conductive paths are randomly formed in the under-gate region, a resistance value of the anti-fuse cells MC after the program operation may vary widely, causing slow read speed of a read operation to the anti-fuse cells MC. In addition, as the conductive paths are randomly formed in the under-gate region, a leakage conductive path may be formed between the bulk node B the drain-source node SD, causing high power consumption.

Figure 2C:
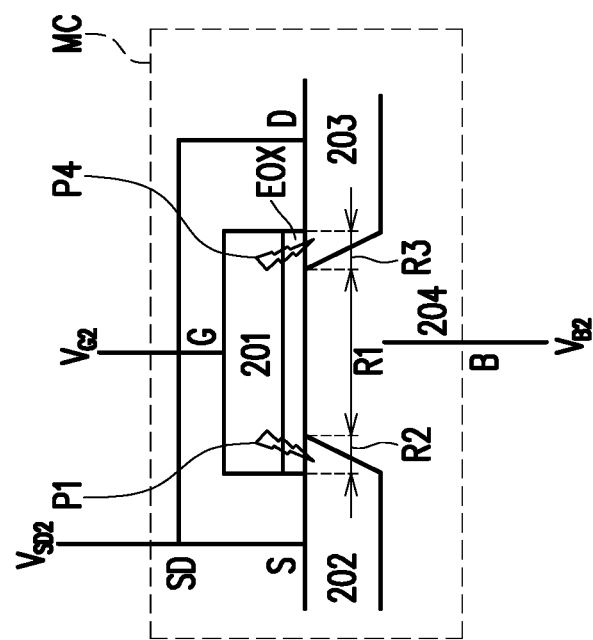

FIG. 2C illustrates an anti-fuse cell MC and bias voltages $V_{G2}$, $V_{SD2}$ and $V_{B2}$ that are applied to the anti-fuse cell MC in a program operation in accordance with some embodiments. During the program operation to the anti-fuse cell MC, the gate bias voltage $V_{G2}$ is applied to the gate node G and the source-drain bias voltage $V_{SD2}$ is applied to the source-drain node SD, in which a voltage level of the gate bias voltage $V_{G2}$ is lower than a voltage level of the source-drain bias voltage $V_{SD2}$. In some embodiments, the gate bias voltage $V_{G2}$ has a negative voltage level and the source-drain bias voltage $V_{SD2}$ has a positive voltage level. In other words, the voltage level of the gate bias voltage $V_{G2}$ is lower than zero volt, and the voltage level of the source-drain bias voltage $V_{SD2}$ is higher than zero volt during the program operation. In an example, the gate bias voltage $V_{G2}$ is set to −2 volts and the source-drain bias voltage $V_{SD2}$ is set to +4 volts during the program operation. In some embodiments, the voltage level of the source-drain bias voltage $V_{SD2}$ should not be too large because large the source-drain bias voltage $V_{SD2}$ may breakdown a source/drain junction, thereby causing a failure in programming the antifuse-cell.

In some embodiments, a voltage difference between the gate bias voltage $V_{G2}$ and the source-drain bias voltage $V_{SD2}$ is higher than a gate oxide breakdown voltage level of the gate oxide layer EOX. When the gate oxide layer EOX is biased by a voltage level that is higher than the gate oxide breakdown voltage level, the gate oxide layer EOX is broken down, thereby forming conductive paths through the gate oxide layer EOX. In other words, the resistance value of the gate oxide layer EOX reduces significantly as the formation of the conductive paths in the gate oxide layer EOX when the gate oxide layer EOX is broken down. The gate oxide breakdown voltage level may vary according to a thickness and material of the gate oxide layer EOX. For example, the gate oxide layer EOX having a thickness of 28 Å may be broken down when the bias gate voltage $V_{G2}$ of −2 volts and the source-drain bias voltage $V_{SD2}$ of +4 volts are applied to the anti-fuse cell MC. It is noted that the values of the bias gate voltage $V_{G2}$, the source-drain bias voltage $V_{SD2}$ and the thickness of the thickness of the oxide layer EOX are not limited to the above exemplary numbers, but are determined according to the designed needs.

Since the voltage difference between the gate bias voltage $V_{G2}$ and the source-drain bias voltage $V_{SD2}$ is higher than the gate oxide breakdown voltage level in the program operation, the gate oxide layer EOX is broken down and the conductive paths are formed between the gate region and the source and drain regions of the anti-fuse cell in the program operation. In addition, as the gate bias voltage $V_{G2}$ has the negative voltage level and the source-drain bias voltage $V_{SD2}$ has the positive voltage level, it does not form conductive paths in the under-gate region. In an example, the formation of the conductive paths may be confined to be in the regions R2 and R3 of the source and drain regions of the anti-fuse cell MC; and no conductive path is formed in the under-gate region (e.g., region R1). As a result, a variation of the resistance value of the anti-fuse cells after the program operation is small, and the leakage path to the bulk terminal B is prevented. Accordingly, the power consumption for the anti-fuse cell is reduced, and a read speed in a read operation is increased. As such, the performance of the anti-fuse cell MC is increased.

In some embodiments, the bulk terminal B is biased by a bulk bias voltage $V_{B2}$ during the program operation, in which a voltage level of the bulk bias voltage $V_{B2}$ is lower than the voltage level of the source-drain bias voltage $V_{SD2}$. In some embodiments, the bulk bias voltage $V_{B2}$ is set to zero volt during the program operation to the anti-fuse cell MC.

Figure 3:
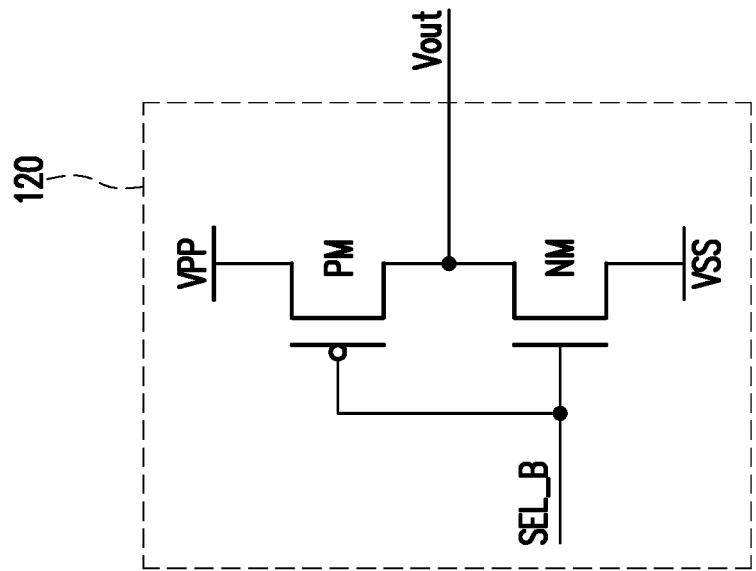
FIG. 3 is a schematic diagram illustrating a biasing circuit of an anti-fuse device in accordance with some embodiments.

FIG. 3 illustrates a schematic diagram of the biasing circuit 120 in accordance with some embodiments. The biasing circuit 120 is configured to generate and provide bias voltages for the anti-fuse cells MC in an operation such as a program operation and a read operation. In some embodiments, the biasing circuit 120 includes transistors PM and NM that are coupled to each other in series. The transistor PM may be a p-type transistor and the transistor NM may be a n-type transistor. The transistors PM and NM are coupled between a reference node that receives the predetermined program voltage VPP and another reference node that receives another predetermined voltage VSS. In some embodiments, the voltage level of the predetermined voltage VSS is zero volt, but the disclosure is not limited thereto.

In some embodiments, the gate of the transistor PM is coupled to the gate of the transistor NM and receives a selection signal SEL_B which may control switching operations of the transistors PM and NM. The biasing circuit 120 is configured to generate an output voltage Vout based on the selection signal SEL_B. When the selection signal SEL_B is at a low logic state (e.g., logic state of 0), the transistor PM is turned on, the transistor NM is turned off, and the biasing circuit 120 outputs the program voltage VPP as the output voltage Vout. When the selection signal SEL_B is at a high logic state (e.g., logic state of 1), the transistor PM is turned off, the transistor NM is turned on, and the biasing circuit 120 outputs the voltage VSS as the output voltage Vout. In some embodiments, the output of the biasing circuit 120 is coupled to the source-drain node SD of the anti-fuse cell MC in the anti-fuse array 110 to supply the program voltage VPP to the source-drain node SD of the anti-fuse cell MC during the program operation. The biasing circuit 120 may generate the biasing voltages for the gate node and the bulk node of the anti-fuse cell MC in a similar manner of generating the program voltage VPP. For example, the biasing circuit 120 may include other pairs of transistors that are similar to the transistors PM and NM for generating the biasing voltages for the gate node and the bulk node of the anti-fuse cell MC.

Figure 4:
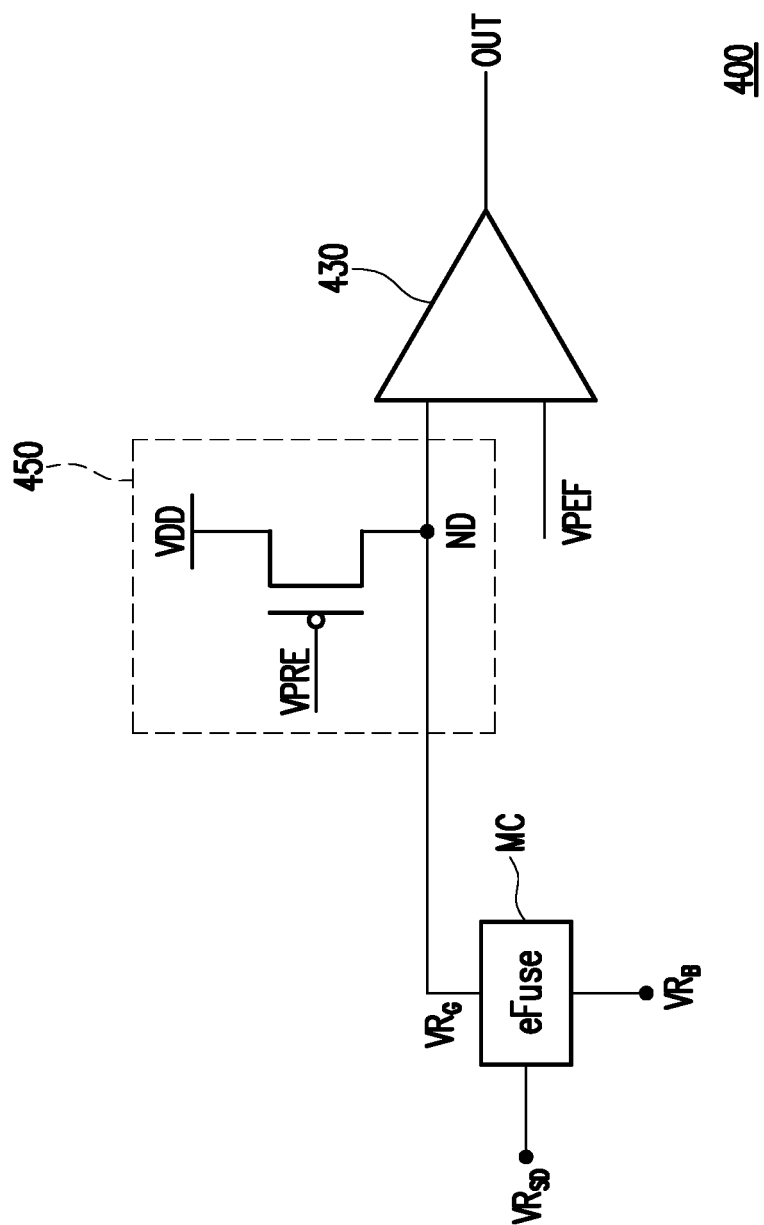
FIG. 4 is a schematic diagram illustrating an anti-fuse cell and a sense amplifier of an anti-fuse device in a read operation in accordance with some embodiments.

FIG. 4 illustrates an anti-fuse cell MC and a sense amplifier 430 of an anti-fuse device 400 in a read operation in accordance with some embodiments. In the read operation, a gate node, a source-drain node and a bulk node of the anti-fuse cell MC are biased by a read gate bias voltage $VR_G$, a read source-drain bias voltage $VR_{SD}$, and a read bulk voltage $VR_B$, respectively. In some embodiments, the anti-fuse device 400 may include a pre-charge circuit 450 that is configured to pre-charge a word line coupled to the gate node of the anti-fuse cell MC in the read operation. The pre-charge circuit 450 may include a transistor coupled between a node ND and a reference node that receives a power voltage VDD. The transistor of the pre-charge circuit 450 receives a control signal VPRE for controlling switching operations of the transistor of the pre-charge circuit 450. When the transistor is turned on by the control signal VPRE, the power voltage VDD is supplied to the gate node. When the transistor of the pre-charge circuit 450 is turned off by the control signal VPRE, the power voltage VDD is terminated from supplying to the gate node. As such, the read bias gate voltage $VR_G$ may be provided by the pre-charge circuit 450. In an example, the read gate bias voltage $VR_G$, the read source-drain bias voltage $VR_{SD}$, and the read bulk voltage $VR_B$ are 1 volt, 0 volt and 0 volt, respectively in the read operation. In some embodiments, the sense amplifier 430 is coupled to compare a signal read from the gate node of the anti-fuse cell MC to a reference voltage VREF to generate an output signal OUT. The output signal OUT may indicate the logic state stored in the anti-fuse cell MC. In some embodiments, as the formation of the conductive paths are confined to the source region, the drain region and edge regions of the gate region of the anti-fuse cell, the resistance variation of the anti-fuse cell after the program operation is small. Accordingly, the read speed of the read operation is improved.

Figure 5:
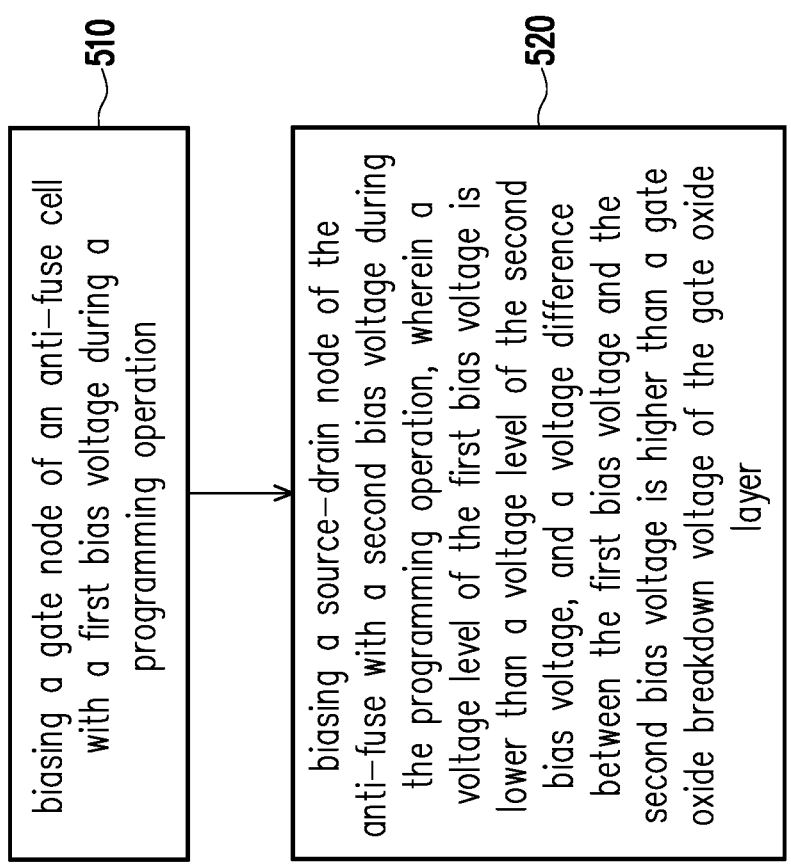
FIGS. 5 and 6 are flowchart diagrams illustrating program methods of an anti-fuse device in accordance with some embodiments.

FIG. 5 is a flowchart diagram illustrating a program method of an anti-fuse cell having a gate node, a gate oxide layer and a source-drain node in accordance with some embodiments. In step S510, the gate node of the anti-fuse cell is biased with a first bias voltage during a program operation. In step S520, the source-drain node of the anti-fuse cell is biased with a second bias voltage during the program operation, wherein a voltage level of the first bias voltage is lower than a voltage level of the second bias voltage, and a voltage difference between the first bias voltage and the second bias voltage is higher than a gate oxide breakdown voltage of the gate oxide layer.

Figure 6:
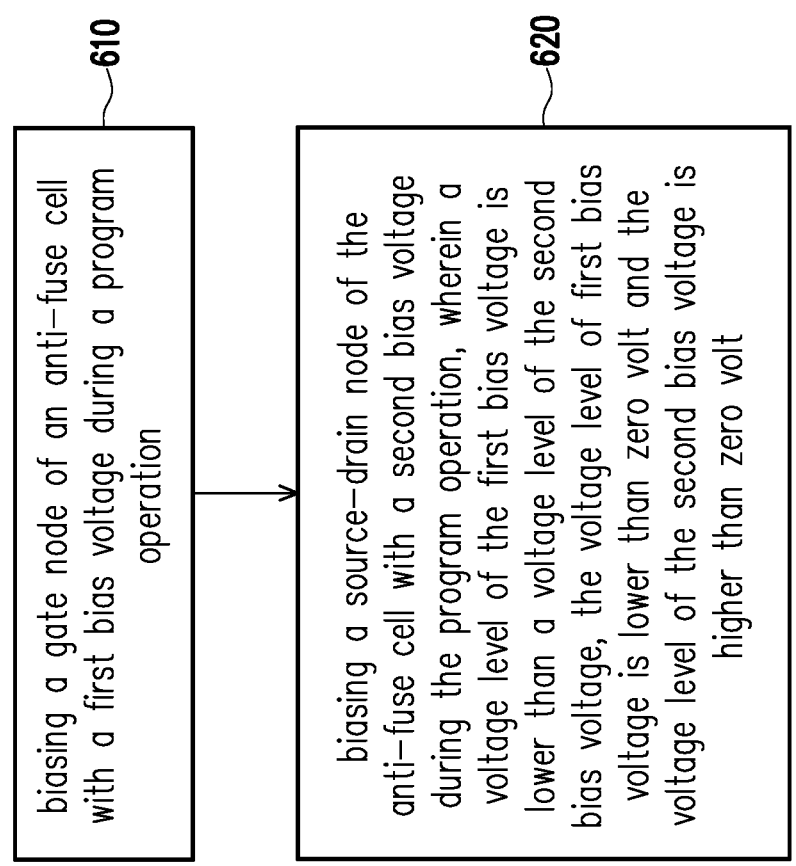

FIG. 6 is a flowchart diagram illustrating a program method of an anti-fuse cell having a gate node, a gate oxide layer and a source-drain node in accordance with some embodiments. In step S610, the gate node of the anti-fuse cell is biased with a first bias voltage during a program operation. In step S620, the source-drain node of the anti-fuse cell is biased with a second bias voltage during the program operation, wherein a voltage level of the first bias voltage is lower than a voltage level of the second bias voltage, the voltage level of the first bias voltage is lower than zero volt and the voltage level of the second bias voltage is higher than zero volt.

In summary, in some embodiments of the disclosure, a gate bias voltage and a source-drain bias voltage are applied to an anti-fuse cell in a program operation to the anti-fuse cell, in which a voltage level of the source-drain bias voltage is higher than a voltage level of the gate bias voltage. The gate bias voltage may have a negative voltage level, and the drain-source bias voltage may have a positive voltage level. As such, the formation of the conductive paths is confined to the source region, the drain region and edge regions of the gate regions of the anti-fuse cell. In this way, the leakage to the bulk node of the anti-fuse cell is prevented and power consumption is saved. In addition, as the resistance variation of the anti-fuse cell after the program operation is relatively small, the read speed in a read operation to the anti-fuse cell is improved. As such, the performance of the anti-fuse device is improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A program method of an anti-fuse cell having a gate node, a gate oxide layer and a source-drain node, the program method comprising:
    biasing the gate node of the anti-fuse cell with a first bias voltage during a program operation; and
    biasing the source-drain node of the anti-fuse cell with a second bias voltage during the program operation,
    wherein the first bias voltage is lower than the second bias voltage, and a voltage difference between the first bias voltage and the second bias voltage is higher than a gate oxide breakdown voltage of the gate oxide layer.

2. The program method of claim 1, wherein
the first bias voltage is lower than zero volt, and
the second bias voltage is higher than zero volt.

3. The program method of claim 1, wherein
the gate oxide layer is located between the gate node and the source-drain node, and
a conductive path is formed between the gate node and the source-drain node when the voltage difference between the first bias voltage and the second biased voltage is higher than the gate oxide breakdown voltage of the gate oxide layer.

4. The program method of claim 3, wherein
the gate node is coupled to a gate region of the anti-fuse cell,
the source-drain node is coupled to a drain region and a source region of the anti-fuse cell,
an edge region of the gate region overlaps the drain region and the source region;
the conductive path is only formed in the edge region of the gate region, the source region and the drain region of the anti-fuse cell.

5. The program method of claim 1, further comprising:
    biasing a bulk node of the anti-fuse cell with a third bias voltage during the program operation, wherein the third bias voltage is lower than the second bias voltage.

6. The program method of claim 5, wherein
the third bias voltage is set to zero volt during the program operation.

7. An anti-fuse device, comprising:
    an anti-fuse array, comprising an anti-fuse cell that includes a gate node, a gate oxide layer and a source-drain node;
    a biasing circuit, coupled to the anti-fuse array, configured to:
        bias the gate node of the anti-fuse cell with a first bias voltage during a program operation; and
        bias the source-drain node of the anti-fuse with a second bias voltage during the program operation, wherein the first bias voltage is lower than the second bias voltage, and a voltage difference between the first bias voltage and the second bias voltage is higher than a gate oxide breakdown voltage of the gate oxide layer.

8. The anti-fuse device of claim 7, wherein
the first bias voltage is lower than zero volt, and
the second bias voltage is higher than zero volt.

9. The anti-fuse device of claim 7, wherein
the gate oxide layer is located between the gate node and the source-drain node, and
a conductive path is formed between the gate node and the source-drain node when the voltage difference between the first bias voltage and the second biased voltage is higher than the gate oxide breakdown voltage of the gate oxide layer.

10. The anti-fuse device of claim 9, wherein
the gate node is coupled to a gate region of the anti-fuse cell,
the source-drain node is coupled to a drain region and a source region of the anti-fuse cell,
an edge region of the gate region overlaps the drain region and the source;
the conductive path is only formed in the edge region of the gate region, the source region and the drain region of the anti-fuse cell.

11. The anti-fuse device of claim 7, wherein the biasing circuit is further configured to:
    bias a bulk node of the anti-fuse cell with a third bias voltage during the program operation, wherein the third bias voltage is lower than the second bias voltage.

12. The anti-fuse device of claim 11, wherein the third bias voltage is set to zero volt during the program operation.

13. The anti-fuse device of claim 7, wherein the biasing circuit comprises:
    a first transistor, coupled between a connection node and a first reference node that receives a first predetermined voltage;
    a second transistor, coupled between the connection node and a second reference node that receive a second predetermined voltage,
    wherein gate nodes of the first transistor and the second transistor receives a selection signal that is configured to control switching operations of the first transistor and the second transistor to generate an output voltage at the connection node.

14. The anti-fuse device of claim 7, further comprising:
a pre-charge circuit, coupled to the anti-fuse cell, configured to pre-charge a word line coupled to the gate node of the anti-fuse cell to a predetermined voltage in a read operation.

15. The anti-fuse device of claim 7, further comprising:
a sense amplifier, coupled to the anti-fuse cell, configured to compare a signal read from the gate node of the anti-fuse cell to a reference voltage to generate an output signal, wherein the output signal indicates the data stored in the anti-fuse cell.

16. A program method of an anti-fuse cell having a gate node, a gate oxide layer and a source-drain node, the program method comprising:
biasing the gate node of the anti-fuse cell with a first bias voltage during a program operation; and
biasing the source-drain node of the anti-fuse cell with a second bias voltage during the program operation,
wherein the first bias voltage is lower than zero volt and the second bias voltage is higher than zero volt.

\* \* \* \* \*